United States Patent [19]
Yamazaki et al.

[11] Patent Number: 5,861,103
[45] Date of Patent: Jan. 19, 1999

[54] ETCHING METHOD AND APPARATUS

[75] Inventors: Shunpei Yamazaki, Tokyo; Takeshi Fukada; Hideomi Suzawa, both of Kanagawa, all of Japan

[73] Assignee: Semiconductor Energy Laboratory Co., Ltd., Kanagawa-ken, Japan

[21] Appl. No.: 687,968

[22] Filed: Jul. 29, 1996

[30] Foreign Application Priority Data

Jul. 28, 1995 [JP] Japan ................................ 7-212906

[51] Int. Cl.$^6$ ................................................ H01L 21/00
[52] U.S. Cl. ............................ 216/66; 216/63; 438/734; 204/192
[58] Field of Search ........................ 216/66, 63; 256/345; 438/734

[56] References Cited

U.S. PATENT DOCUMENTS

| | | | |
|---|---|---|---|
| 4,496,448 | 1/1985 | Tai | 204/192 |
| 4,810,322 | 3/1989 | Gut | 156/345 |
| 4,950,377 | 8/1990 | Huebner | 204/192.32 |
| 5,259,922 | 11/1993 | Yamano | 156/643 |
| 5,681,419 | 10/1997 | Yoon | 156/345 |

*Primary Examiner*—Ceila Chang
*Attorney, Agent, or Firm*—Fish & Richardson P.C.

[57] ABSTRACT

Each of a pair of electrodes is provided in high-frequency power supply. A sample placed on the one of electrodes is etched by RIE (reactive ion etching) method. At the time, the power supply connected to the other electrode opposite to the sample is actuated first, and then the power supply of the one electrode on which the sample has been placed is actuated. And then the power supply connected to the other electrode is stopped. Therefore a bias voltage applied to the sample is gradually varied to suppress the abrupt application of a voltage to the sample.

16 Claims, 4 Drawing Sheets

ETCHING METHOD AND APPARATUS

BACKGROUND OF THE INVENTION

1. Field of the Invention

The present invention relates to an etching method and apparatus using RIE (reactive ion etching). For example, the invention can be utilized in a semiconductor device manufacturing process.

2. Description of the Related Art

Conventionally, RIE (reactive ion etching) is known as an anisotropic dry etching method. As shown in FIG. 4A, in RIE, a sample 403 to be etched is provided on the side of a feeder electrode 402 to which a high-frequency power supply 404 is connected. Hich-frequency discharge is caused between the feeder electrode 402 and a grounding electrode 401 (in this example, a chamber of the apparatus serves as this electrode) that is kept at the ground potential, to perform vertical, anisotropic etching on the sample 403.

In the arrangement of FIG. 4A, a potential profile as shown in FIG. 4B is established in the state of high-frequency discharge. If $CF_4$, $NF_3$, $CCl_4$, or the like are used as an etching gas, fluorine ions (F+) or chlorine ions (Cl+) is accelerated toward the sample 403 side by a negative, deep self-bias near the feeder electrode 402, to effect vertical, anisotropic etching.

FIGS. 2A and 2B show an etching process performed with the above etching apparatus. FIG. 2A shows a structure having, on a glass substrate 201, an active layer 202 of a thin-film transistor, a gate insulating film 203 covering the active layer 202, and a gate electrode 204 provided on the gate insulating film 203. As shown in FIG. 2B, the exposed portions of the gate insulating film 203 are removed by RIE in which the gate electrode 204 used as a mask.

However, in the process of FIGS. 2A and 2B, it frequently occurs that the gate insulating film 203 is broken electrically. This is considered to be caused by an instantaneous application of a negative. deep bias voltage (as deep as minus several hundred volts under certain conditions) occurring near the feeder electrode 402 (see FIG. 4B) at the start of RIE.

That is, it is considered that at the start of etching a high voltage that is instantaneously applied between the exposed gate electrode 204 and the active layer 202 that is covered with the gate insulating film 203 causes electrostatic breakdown of the gate insulating film 203.

A similar phenomenon also occurs at the end of the etching step. This is considered as a phenomenon due to a fast variation of the voltage being applied to the sample when the bias voltage of the sample is removed.

SUMMARY OF THE INVENTION

In view of the above, an object of the present invention is to provide an etching method and apparatus which can avoid such a case that a high voltage is abruptly applied to an etching sample at the start and end of RIE.

To attain the above object, according to a first aspect of the invention, there is provided a method for etching a sample that is provided on a first one of a pair of electrodes opposed to each other, comprising the steps of supplying high-frequency power to a second one of the pair of electrodes; supplying high-frequency power to the first electrode; stopping the supply of the high-frequency power to the second electrode; and performing RIE on the sample while continuing the supply of the high-frequency power to the first electrode.

According to another aspect of the invention, there is provided a method for etching a sample that is provided on a first one of a pair of electrodes opposed to each other, comprising the steps of effecting high-frequency discharge in a state that high-frequency power is supplied to a second one of the pair of electrodes while the first electrode is set at a ground potential in terms of DC (direct current); supplying high-frequency power to the first electrode; stopping the supply of the high-frequency power to the second electrode; and performing RIE on the sample by effecting high-frequency discharge in a state that the second electrode is set at the ground potential in terms of DC.

According to still another aspect of the invention, there is provided a method for etching a sample that is provided on a first one of a pair of electrodes opposed to each other, comprising the steps of supplying high-frequency power to each of the pair of electrodes; stopping the supply of the high-frequency power to a second one of the pair of electrodes; and performing RIE on the sample while continuing the supply of the high-frequency power to the first electrode.

According to a further aspect of the invention, there is provided a method for etching a sample that is provided on a first one of a pair of electrodes opposed to each other, comprising the steps of supplying high-frequency power to each of the pair of electrodes; stopping the supply of the high-frequency power to a second one of the pair of electrodes; and performing RIE on the sample while continuing the supply of the high-frequency power to the first electrode and setting the second electrode at a ground potential.

In each of the above method, in supplying and/or stopping the supply of high-frequency power, the high-frequency power may be varied continuously. That is, the high-frequency power may be increased gradually in supplying it, and may be decreased gradually to finally stop its supply.

Further, in each of the above method, in supplying and/or stopping the supply of high-frequency power, the high-frequency power may be varied in a step-like manner. That is, the high-frequency power may be increased in a step-like manner in supplying it, and may be decreased in a step-like manner to finally stop its supply.

According to another aspect of the invention, there is provided an etching apparatus comprising a pair of electrodes opposed to each other; high-frequency power supplies respectively provided for the pair of electrodes; and inductors for respectively grounding the pair of electrodes.

FIG. 1A shows a specific example of the above configuration. High-frequency power supplies 101 and 110 are respectively provided for a pair of electrodes 104 and 102. The electrodes 104 and 102 are grounded via coils (inductors) 103 and 107.

The high-frequency power supplies may be ones that can generate a necessary amount of power. Their oscillation frequency is generally 13.56 MHz, and may be arbitrarily selected from a frequency range which assures stable discharge. In generally such a frequency range is from several megahertz to several tens of megahertz.

The inductors are not limited to coils, but may be any inductors having a high impedance above a given frequency. The inductors are required to have a high-frequency impedance which can sufficiently stop high-frequency power supplied from the high-frequency power supplies. Therefore, the inductance value of the inductors should be determined to provide such an impedance. The inductors may be replaced by resistors having a large resistance.

According to a further aspect of the invention, there is provided an etching apparatus comprising a pair of electrodes opposed to each other; high-frequency power supplies respectively provided for the pair of electrodes; and means for respectively isolating the pair of electrodes from a ground potential in terms of high frequency and grounding those in terms of DC.

FIG. 1A shows a specific example of the above configuration. In this example, coils 103 and 107 prevents high-frequency powers which is supplied from the high-frequency power supplies 101 and 110 to a pair of electrodes 104 and 102 from going into the ground level. That is, the electrodes 104 and 102 are isolated from the ground potential in terms of high frequency. On the other hand, the electrodes 104 and 102 are grounded in terms of DC by the coils 103 and 107.

In operation, first, a self-bias is applied to the opposed electrode 104 as shown in FIG. 1B. Then, a self-bias is applied to the sample-side electrode step by step as shown in FIGS. 1C and 1D. In this manner, abrupt application of a bias voltage to a sample can be avoided, whereby electrical breakdown of an etching sample can be prevented.

The above operation will be described in more detail below. First, high-frequency power is supplied from the high-frequency power supply 101 to the opposed electrode 104. The high-frequency power supply 110 is not activated in this state. In this state, the opposed electrode 104 is isolated from the ground level, that is, it is not grounded in terms of high frequency by the coil 103. On the other hand, the sample-side electrode 102 is grounded in terms of DC by the coil 107. Therefore, in electrical terms, the opposed electrode 104 and the sample-side electrode 102 are a feeder electrode and a grounding electrode, respectively. Thus, a potential gradient as shown in FIG. 1B is obtained between the electrodes 104 and 102.

Thereafter, high-frequency power is supplied from the high-frequency power supply 110 to the electrode 102. In this state, neither electrodes 104 and 102 are grounded in terms of high frequency by the coils 103 and 107 and both electrodes 104 and 102 are supplied with the high-frequency power. Thus, a symmetrical potential gradient obtained between the electrodes 104 and 102 is shown in FIG. 1C.

Then, the supply of high-frequency power from the high-frequency power supply 101 is stopped, so that the electrode 104 is grounded in terms of DC by the coil 103. In this state, the sampleside electrode 102 serves as a feeder electrode and the opposed electrode 104 serves as a grounding electrode. Thus, a potential gradient as shown in FIG. 1D is obtained, which is the same as in the ordinary RIE process.

Then desired etching by RIE method is performed by keeping the state of FIG. 1D for a predetermined period.

With the above operation, the bias voltage applied to the electrode 102 on which the etching sample 111 is provided can be increased step by step. Therefore, the problems caused by abrupt application of a bias voltage can be avoided.

After completion of the etching, an operation reverse to the above is performed. This can avoid an abrupt variation of the voltage applied to the etching sample.

DETAILED DESCRIPTION OF THE PREFERRED EMBODIMENTS

Embodiment 1

Figure 1A:
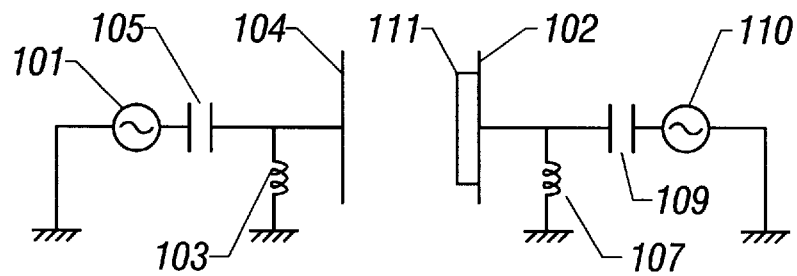
FIGS. 1A–1D show a plasma etching method and apparatus according to embodiments of the present invention.

This embodiment is directed to an etching method and apparatus which can avoid such a case that a bias voltage is abruptly applied to a sample in performing RIE. FIG. 1A shows a general configuration of this embodiment, in which an opposed electrode 104 not provided with a sample 111 is a flat plate or a mesh made of stainless steel.

A high-frequency power of 13.56 MHz is applied to the electrode 104. The value of the high-frequency power is determined properly in accordance with the etching material, etching gas, and etching conditions.

A blocking capacitor 105 prevents DC component from being applied to the electrode 104 and, conversely, to a high-frequency power supply 101. A coil 103 has proper resistance and inductance values. The inductance of the coil 103 is set at such a value as to prevent a high-frequency generated by the high-frequency power supply 101 from going into the ground level. The coil 103 also has a function of keeping the electrode 104 at the ground level in terms of DC An electrode 102, on which the etching sample 111 is provided, is made of the same material and has the same dimensions as the electrode 104. The sample 111 may be a thin-film transistor under manufacture, a silicon wafer, or other samples that require vertical, anisotropic etching.

A coil 107 has the same inductance as the coil 103, and prevents a high-frequency generated by a high-frequency power supply 110 from going into the ground level. A blocking capacitor 109 has the same functions as the blocking capacitor 105.

FIG. 1A only outlines the electrical configuration, and there are additionally provided a unit for introducing necessary etching and diluting gases and an exhaust for exhausting an unnecessary gas and keeping the desired pressure, as well as a matching unit for taking impedance matching between the high-frequency power supplies 101 and 110 and electrodes 104 and 102.

In the configuration of FIG. 1A, the high-frequency power supplies 101 and 110, the blocking capacitors 105 and 109, the coils 103 and 107, and the electrodes 104 and 102 are provided in pairs and the items of each pair may be substantially identical to each other. However, the items of each pair need not always be identical. For example, the high-frequency power supplies 101 and 110 may have different frequencies or a phase difference, or the electrodes 104 and 102 may be different in dimensions or material.

Figure 2A:
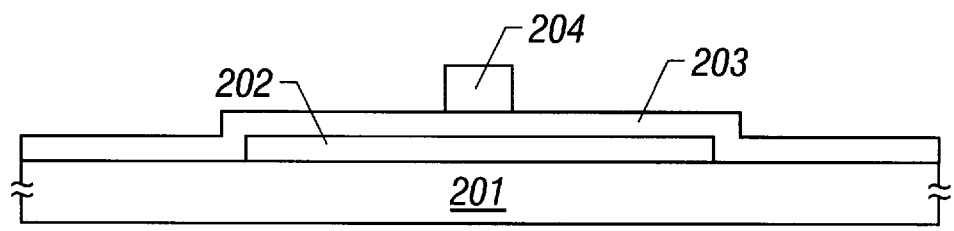
FIGS. 2A and 2B show a thin-film transistor manufacturing process using plasma etching.

A description will be made of an example of operation in which a silicon oxide film is etched by using the etching apparatus of FIG. 1A. As shown in FIG. 2A, first, a crystalline silicon active layer 202 is formed on a glass substrate 201. A silicon oxide film 203 to become a gate insulating film is so formed as to cover the active layer 202. Further, a gate electrode 204 is formed by using aluminum. tungsten silicide, or crystalline silicon having one conductivity type.

In the state of FIG. 2A, the exposed portions of the silicon oxide film 203 are removed by the etching apparatus of FIG. 1A. Mixture gas of $CF_4$ and $O_2$ is used as an etching gas.

Figure 1B:
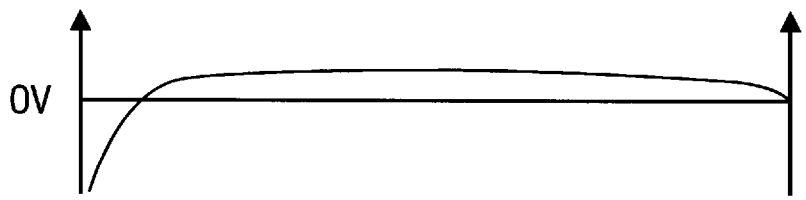

In the etching step, first, after predetermined conditions of atmosphere and pressure are established, high-frequency power is applied to the opposed electrode 104. At this time, no high-frequency power is applied to the sample-side electrode 102. In this state, as shown in FIG. 1B, a negative bias voltage is applied to the opposed electrode 104. On the other hand, almost no bias voltage is applied to the sample 111 which is provided the sample-side electrode 102 and assumes the state of FIG. 2A. This state is maintained for one second.

Then, high-frequency power is applied from the high-frequency power supply 110 to the sample-side electrode 102 while the high-frequency power is kept applied to the opposed electrode 104. The frequency and the power value of the high-frequency power supplied from the power supply 110 to the electrode 102 are set the same as those of the high-frequency power supplied from the power supply 101 to the electrode 104. This state is kept for one second.

Figure 1C:
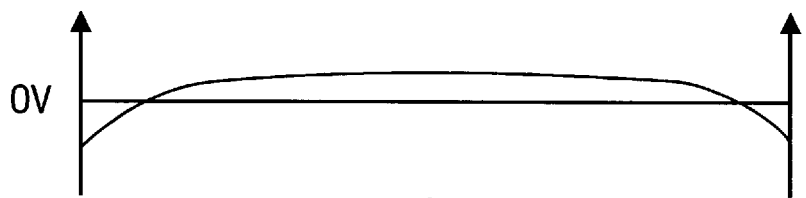

In the state that the high-frequency powers are supplied from both high-frequency power supplies 101 and 110, a potential gradient as shown in FIG. 1C is obtained between the electrodes 104 and 102. That is, a small bias voltage is applied to the sample 111.

Figure 1D:
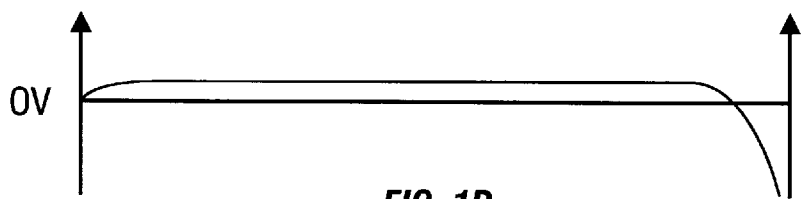

Then, the power that has been supplied from the high-frequency power supply 101 to the electrode 104 is stopped. As a result, the opposed electrode 104 is grounded in terms of DC, and a potential gradient as shown in FIG. 1D is obtained between the electrodes 104 and 102. That is, a negative, deep bias voltage is applied to the sample-side electrode 102.

Figure 2B:
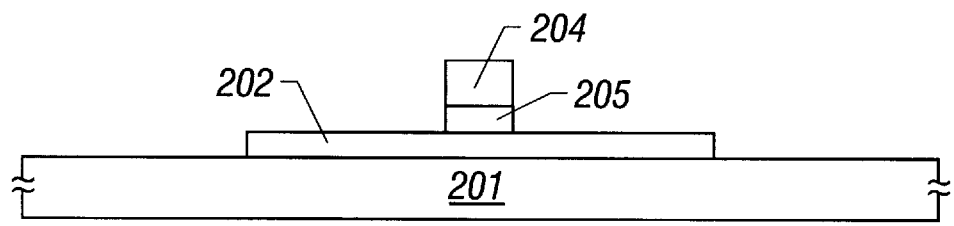

In this state, RIE is performed for a predetermined period. As a result, the exposed portions of the silicon oxide film 203 are removed as shown in FIG. 2B.

After completion of the etching, the same amount of power as that being supplied from the high-frequency power supply 110 to the sample-side electrode 102 is supplied from the high-frequency power supply 101 to the opposed electrode 104. As a result, the potential gradient is changed from the state of FIG. 1D to that of FIG. 1C.

Then, the power output from the high-frequency power supply 110 is stopped, so that the potential gradient is changed from the state of FIG. 1C to the state of FIG. 1B.

With the above operation, the bias voltage applied to the sample-side electrode 102 is increased in two steps at the start of etching and decreased also in two steps at the end of etching. Thus, the gate insulating film 203 can be protected from the electrical breakdown due to abrupt voltage application.

Embodiment 2

This embodiment is similar to the first embodiment, in addition, the value of power applied to each electrode is further varied. At the start of etching, first a predetermined power is supplied from the high-frequency power supply 101 to the opposed electrode 104. After this state has been kept for a predetermined period, 10% of the power being supplied from the high-frequency power supply 101 is supplied from the high-frequency power supply 110 to the sample-side electrode 102. And the power applied to the sample-side electrode 102 is increased at a predetermined rate to a value equal to the power being supplied from the high-frequency power supply 101.

Thereafter, the power supplied from the high-frequency power supply 101 to the opposed electrode 104 is reduced to 10% of the desired value at a given rate. The power output from the high-frequency power supply 101 is then stopped.

As a result, a negative, deep bias voltage is applied to the sample 111; RIE is performed in this state.

After completion of the etching, 10% of the power being supplied from the high-frequency power supply 110 is supplied from the high-frequency power supply 101 to the opposed electrode 104 and then increased at a predetermined rate. When the power values of the two high-frequency power supplies 101 and 110 have become identical, the output of the high-frequency power supply 110 is reduced to 10% at a predetermined rate.

Thereafter, the power output from the high-frequency power supply 101 is stopped. In this state, almost no bias voltage is applied to the sample 111.

According to this embodiment, the bias voltage applied to the sample 111 can be increased gradually at the start of etching and decreased gradually at the end of etching.

Embodiment 3

This embodiment is started in that the state of FIG. 1C as initial state, and in the state of FIG. 1D, RIE is performed. After completion of etching, the supply of power to both electrodes is stopped in the state of FIG. 1C.

In this embodiment, first, both high-frequency power supplies 101 and 110 are activated at the same time in desired pressure and atmosphere are established. As a result, the potential gradient of FIG. 1C is obtained between the opposed electrode 104 and the sample-side electrode 102. In this state, the bias voltage applied to the sample 111 is low though it is not zero.

The state of FIG. 1D is then obtained by stopping the supply of power from the high-frequency power supply 101. Desired anisotropic plasma etching by RIE method is performed in this state.

After completion of the etching, high-frequency power is supplied from the high-frequency power supply 101 to the opposed electrode 104. The value of this high-frequency power is set the same as the high-frequency power being supplied from the high-frequency power supply 110 to the sample-side electrode 102. to obtain the state of FIG. 1C. The etching step is finished by stopping the application of power from the high-frequency.

According to this embodiment, the bias voltage applied to the sample 111 can be changed in a step-like manner at the start and end of etching. Therefore, the problems as would otherwise be caused by abrupt application of a bias voltage to the sample 111 can be avoided.

Embodiment 4

Figure 3:
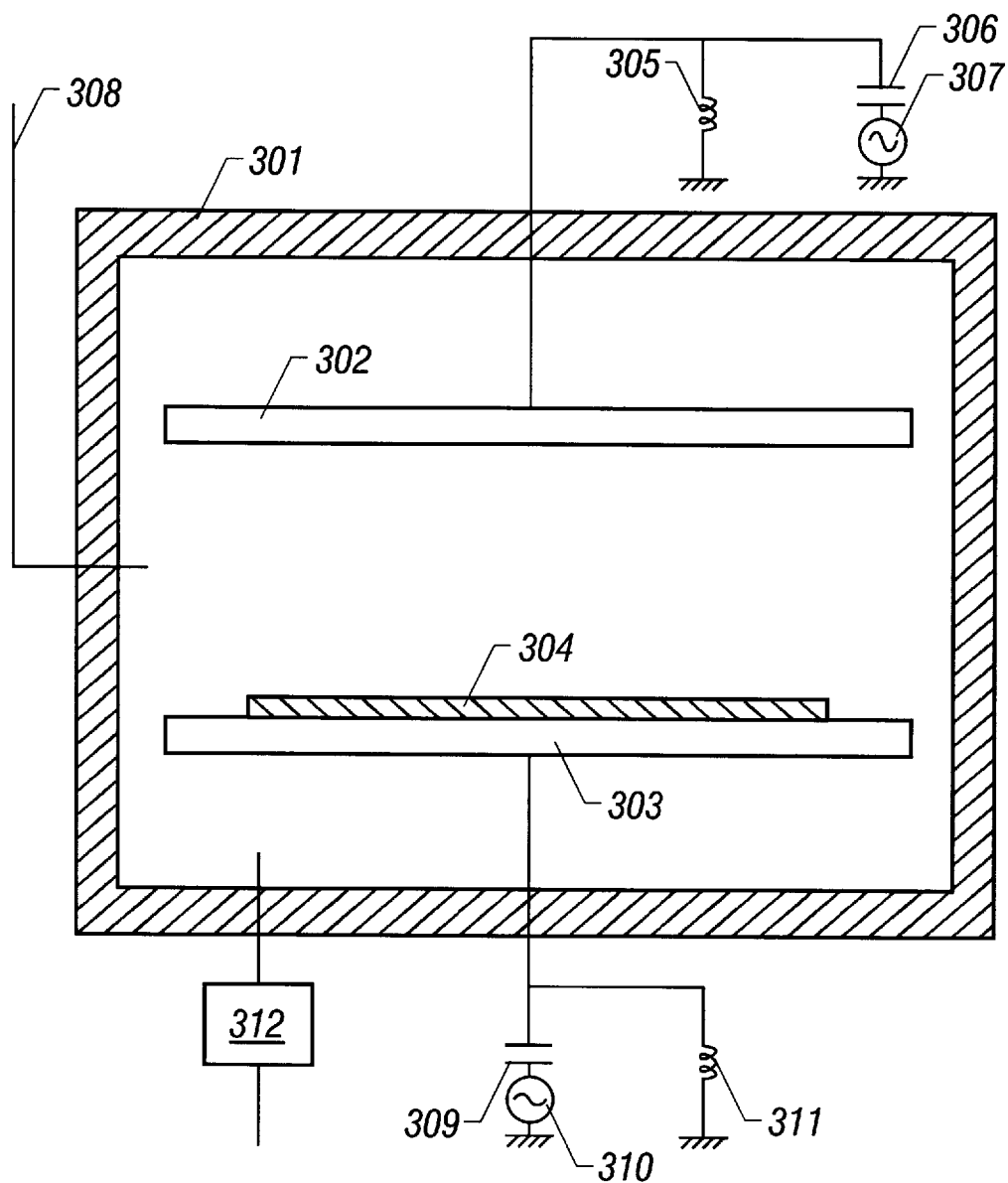
FIG. 3 shows a general configuration of a plasma etching apparatus according to a third embodiment of the invention.
Figure 4A:
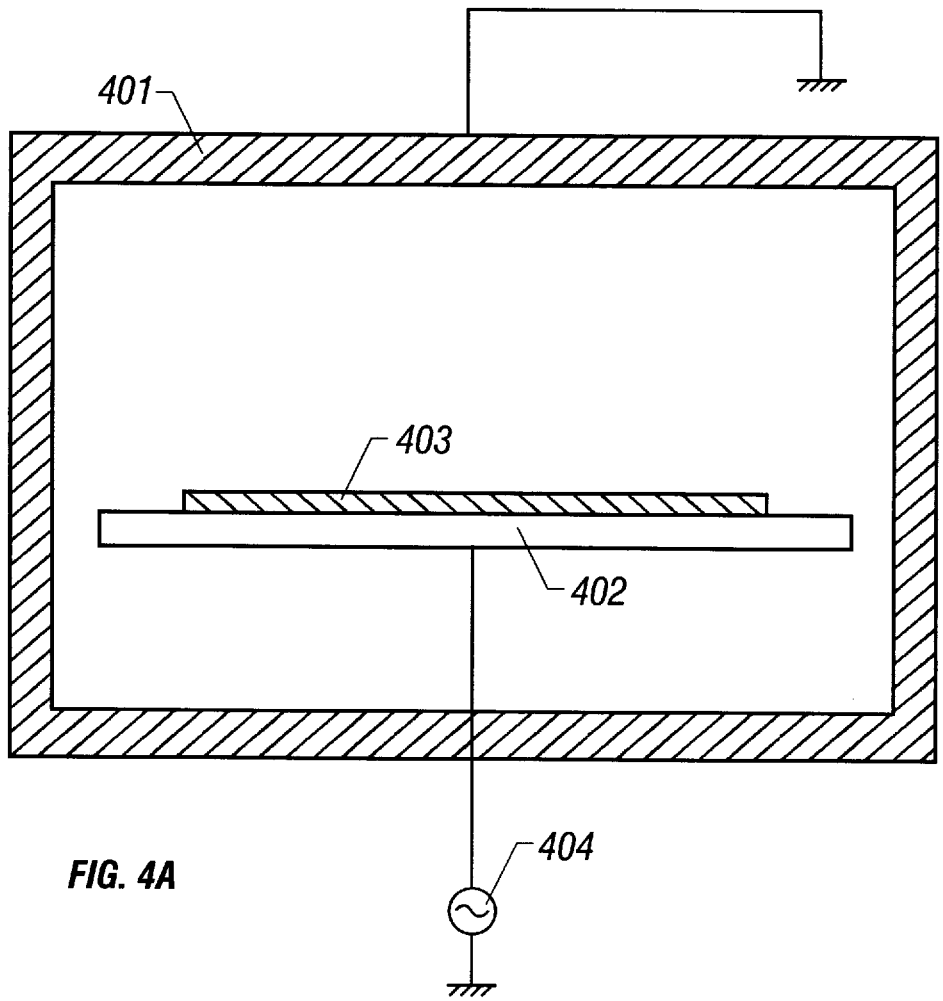
FIGS. 4A and 4B outline a conventional etching apparatus using RIE.
Figure 4B:
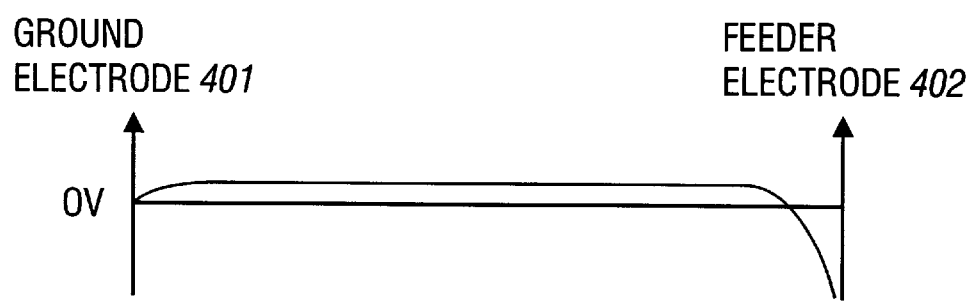

FIG. 3 shows a general configuration of an etching apparatus according to this embodiment. As shown in FIG. 3, a pair of electrodes 302 and 303 is provided in a chamber 301 capable of keeping itself airtight. An etching sample 304 is placed on the one electrode 303. The vacuum chamber 301 and the electrodes 302 and 303 are made of stainless steel.

A high-frequency power supply 307 capable of supplying a high-frequency power of 13.56 MHz is connected to the electrode 302 via a blocking capacitor 306. The coil 305 prevents high-frequency power generated by the high-frequency power supply 307 from going into the ground level. The coil 305 also has a function of keeping the electrode 302 at the ground level in terms of DC when the power output from the high-frequency power supply 307 is stopped.

On the other hand, the etching sample 304 is placed on the electrode 303. A high-frequency power of 13.56 MHz is supplied from a high-frequency power supply 310 to the electrode 303 via a blocking capacitor 309. A coil 311 insulates the electrode 303 from the ground potential in terms of high frequency and grounds it in terms of DC.

Desired etching and diluting gases are introduced through a gas supply system 308. An exhaust pump 312 has a function of keeping the inside of the low-pressure chamber 301 at a desired pressure.

For example, the etching apparatus of FIG. 3 operates in the following manner. First, high-frequency power is supplied from the high-frequency power supply 307 to the electrode 302. Then, another high-frequency power is supplied from the high-frequency power supply 310 to the electrode 303. Thereafter, the supply of power from the high-frequency power supply 307 to the electrode 302 is stopped. In this state, RIE is performed on the sample 304.

As described above, according to the invention, power is first supplied to the electrode that is not provided with a sample, then supplied to the sample-side electrode, and finally the supply of power to the electrode not provided with the sample is stopped. Thus, a bias voltage is applied to the sample in a step-like manner. Therefore, the problems caused by abrupt application of a bias voltage to the sample can be avoided.

After completion of etching, an operation reverse to the above is performed. This avoids the problems caused by an abrupt variation of the bias voltage applied to the sample.

What is claimed is:

1. A method for etching a sample by using an etching chamber having first and second electrodes spaced from each other wherein the sample is attached to the second electrode, sequentially comprising the steps of:

preparing the pair of electrodes in the chamber;

introducing an etching gas into the chamber;

supplying a first high-frequency power to the first electrode;

supplying a second high-frequency power to the second electrode while continuing to supply the first high-frequency power to the first electrode;

stopping the supply of the first high-frequency power to the first electrode while continuing the supply of the second high-frequency power to the second electrode; and performing reactive ion etching of the sample by using the etching gas while continuing the supply of the second high-frequency power to the second electrode.

2. The method of claim 1 wherein the first and second high-frequency powers are varied continuously or in a step-like manner in supplying the high-frequency powers to the electrodes, respectively.

3. The method of claim 1 wherein the first high-frequency power is varied continuously or in a step-like manner in stopping the supply of the power to the other electrode.

4. A method for etching a sample provided on one of a pair of electrodes opposed to each other, sequentially comprising the steps of:

preparing the pair of electrodes in a chamber;

introducing an etching gas into the chamber;

performing a high-frequency discharge between the electrodes wherein a first high-frequency power is supplied to the other electrode while the one electrode is set at a dc ground potential;

supplying a second high-frequency power to the one electrode while continuing the supply of the first high-frequency power to the other electrode;

stopping the supply of the first high-frequency power to the other electrode while continuing the supply of the second hiqh-frecuency power to the one electrode; and performing reactive ion etching on the sample while the other electrode is set at a dc ground potential.

5. The method of claim 4 wherein the first and second high-frequency powers are varied continuously or in a step-like manner in supplying the high-frequency powers to the electrodes, respectively.

6. The method of claim 4 wherein the first high-frequency power is varied continuously or in a step-like manner in stopping the supply of the high-frequency power to the other electrode.

7. A method for etching a sample provided on one of a pair of electrodes opposed to each other, sequentially comprising the steps of:

preparing the pair of electrodes in a chamber;

introducing an etching gas into the chamber;

supplying high-frequency powers to the pair of electrodes, respectively;

stopping the supply of one high-frequency power to only one of the pair of electrodes; and performing reactive ion etching on the sample while continuing the supply of the other high-frequency power to the other electrode.

8. The method of claim 7 wherein the high-frequency powers are varied continuously or in a step-like manner in supplying the high-frequency powers to the electrodes, respectively.

9. The method of claim 7 wherein the one high-frequency power is varied continuously or in a step-like manner in stopping the supply of the high-frequency power to the other electrode.

10. A method for etching a sample provided on one of a pair of electrodes opposed to each other, sequentially comprising the steps of:

preparing the pair of electrode in a chamber;

introducing an etching gas into said chamber;

supplying high-frequency powers to the pair of electrodes, respectively;

stopping the supply of one of the high-frequency powers to only the other electrode; and performing reactive ion etching on the sample while continuing the supply of the other high-frequency power to the one electrode and setting the other electrode at a ground potential.

11. The method of claim 1 wherein the high-frequency powers are varied continuously or in a step-like manner in supplying the high-frequency powers to the electrodes, respectively.

12. The method of claim 1 wherein the one high-frequency power is varied continuously or in a step-like manner in stopping the supply of the high-frequency power to the other electrode.

13. The method according to claim 1 wherein said etching gas is selected from the group consisting of $CF_4$, $NF_3$, and $CCl_4$.

14. The method according to claim 4 wherein said etching gas is selected from the group consisting of $CF_4$, $NF_3$, and $CCl_4$.

15. The method according to claim 7 wherein said etching gas is selected from the group consisting of $CF_4$, $NF_3$, and $CCl_4$.

16. The method according to claim 10 wherein said etching gas is selected from the group consisting of $CF_4$, $NF_3$, and $CCl_4$.

* * * * *

UNITED STATES PATENT AND TRADEMARK OFFICE
CERTIFICATE OF CORRECTION

PATENT NO. : 5,861,103
DATED : January 19, 1999
INVENTOR(S) : Hideomi Suzawa, Shunpei Yamazaki and Takeshi Fukada It is certified that error appears in the above-identified patent and that said Letters Patent is hereby corrected as shown below:

Please amend claims 11 and 12 in the above-identified patent to read:

Column 8:
11. (Amended) The method of claim [1] 10 wherein the high-frequency powers are varied continuously or in a step-like manner in supplying the high-frequency powers to the electrodes, respectively.

12. (Amended) The method of claim [1] 10 wherein the one high-frequency power is varied continuously or in a step-like manner in stopping the supply of the high-frequency power to the other electrode.

Signed and Sealed this

Twenty-sixth Day of June, 2001

Attest:

NICHOLAS P. GODICI
*Attesting Officer*  *Acting Director of the United States Patent and Trademark Office*